(12) United States Patent
Akiyama et al.

(10) Patent No.: US 7,935,611 B2
(45) Date of Patent: May 3, 2011

(54) METHOD FOR MANUFACTURING SUBSTRATE FOR PHOTOELECTRIC CONVERSION ELEMENT

(75) Inventors: Shoji Akiyama, Gunma (JP); Yoshihiro Kubota, Gunma (JP); Atsuo Ito, Gunma (JP); Makoto Kawai, Gunma (JP); Yuuji Tobisaka, Gunma (JP); Koichi Tanaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 243 days.

(21) Appl. No.: 12/282,176

(22) PCT Filed: Mar. 12, 2007

(86) PCT No.: PCT/JP2007/054793
§ 371 (c)(1),
(2), (4) Date: Sep. 9, 2008

(87) PCT Pub. No.: WO2007/105675
PCT Pub. Date: Sep. 20, 2007

(65) Prior Publication Data
US 2009/0061557 A1 Mar. 5, 2009

(30) Foreign Application Priority Data
Mar. 13, 2006 (JP) .................. 2006-067792

(51) Int. Cl.
*H01L 21/46* (2006.01)
*H01L 31/00* (2006.01)
(52) U.S. Cl. .................. 438/457; 257/E21.122; 136/261
(58) Field of Classification Search .................. 438/457; 257/E21.122
See application file for complete search history.

(56) References Cited

U.S. PATENT DOCUMENTS

| 5,374,564 A | 12/1994 | Bruel |
| 5,882,987 A | 3/1999 | Srikrishnan |
| 6,100,166 A | 8/2000 | Sakaguchi et al. |
| 6,534,382 B1 | 3/2003 | Sakaguchi et al. |

(Continued)

FOREIGN PATENT DOCUMENTS

JP 62 291183 12/1987

(Continued)

OTHER PUBLICATIONS

King, R. R. et al., "Metamorphic GaInP/GaInAs/Ge Solar Cells", Proc. 28th IEEE Photovoltaic Specialists Conf., pp. 982-985, (2000).

(Continued)

*Primary Examiner* — W. David Coleman
(74) *Attorney, Agent, or Firm* — Oblon, Spivak, McClelland, Maier & Neustadt, L.L.P.

(57) ABSTRACT

A silicon layer having a conductivity type opposite to that of a bulk is provided on the surface of a silicon substrate and hydrogen ions are implanted to a predetermined depth into the surface region of the silicon substrate through the silicon layer to form a hydrogen ion-implanted layer. Then, an n-type germanium-based crystal layer whose conductivity type is opposite to that of the silicon layer and a p-type germanium-based crystal layer whose conductivity type is opposite to that of the germanium-based crystal layer are successively vapor-phase grown to provide a germanium-based crystal. The surface of the germanium-based crystal layer and the surface of the supporting substrate are bonded together. In this state, impact is applied externally to separate a silicon crystal from the silicon substrate along the hydrogen ion-implanted layer, thereby transferring a laminated structure composed of the germanium-based crystal and the silicon crystal onto the supporting substrate.

16 Claims, 7 Drawing Sheets

U.S. PATENT DOCUMENTS

2003/0203547 A1    10/2003    Sakaguchi et al.

FOREIGN PATENT DOCUMENTS

| | | |
|---|---|---|
| JP | 5 211128 | 8/1993 |
| JP | 6 291341 | 10/1994 |
| JP | 9 255487 | 9/1997 |
| JP | 10 233352 | 9/1998 |
| JP | 10 335683 | 12/1998 |
| JP | 11 121377 | 4/1999 |
| JP | 2001 53299 | 2/2001 |
| WO | 2005 096397 | 10/2005 |

OTHER PUBLICATIONS

Hammond, Martin L. "Silicon Epitaxy", Solid State Technology, vol. 2, pp. 68-75, (1978).

US 7,935,611 B2

METHOD FOR MANUFACTURING SUBSTRATE FOR PHOTOELECTRIC CONVERSION ELEMENT

TECHNICAL FIELD

The present invention relates to a method for manufacturing a substrate for photoelectric conversion elements, such as a solar cell, in which a laminated body composed of a germanium-based crystal and a silicon crystal is formed on a supporting substrate using a bonding technique.

BACKGROUND ART

As one of photoelectric conversion elements, there is a solar cell and, as a material thereof, there is used a III-V group compound semiconductor, including monocrystalline, polycrystalline or noncrystalline silicon (Si), germanium (Ge), and GaAs, a II-VI group compound semiconductor, such as CdS, or the like. As the device structure of the solar cell, there are known a pn junction, pin junction, a tandem structure, and the like.

In recent years, efforts are being made to develop photoelectric conversion elements making use of Ge, with the aim of realizing the high efficiency of solar cells by effectively utilizing the optical spectrum of sunlight. For example, there have been proposed a tandem-type solar cell in which Ge is used in the bottommost layer thereof (GaInP/GaAs/Ge-based solar cell) (R. R. King et. al., "Metamorphic GaInP/GaInAs/Ge Solar Cells." Proc. 28th IEEE Photovoltaic Specialists Conf. (IEEE. New York, 2000), p. 982) and a tandem-structured photoelectric conversion element laminated with a silicon crystal cell for photoelectrically converting light having a wavelength of approximately 1.1 µm or less and a germanium-based crystal cell for photoelectrically converting sunlight having a waveband of 1.1 to 1.6 µm (for example, Japanese Patent Laid-Open No. 6-291341).

FIG. 1 is a cross-sectional schematic view used to explain the structure of a conventional tandem-structured photoelectric conversion element laminated with a silicon crystal cell and a germanium-based crystal cell. This element has a tandem structure in which a germanium-based crystal cell 2 for absorbing and photoelectrically converting light ($hv_1$) having a band of wavelengths greater than 1.1 µm and a silicon crystal cell 1 for absorbing and photoelectrically converting light ($hv_2$) having a band of wavelengths equal to or less than 1.1 µm are laminated. These cells are pn junction type cells in which layers (1A and 1B, and 2A and 2B) of mutually opposite conductivity types ("p" type and "n" type) are respectively laminated. A pn junction is also formed at a boundary face between the silicon crystal cell 1 and the germanium-based crystal cell 2.

In the upper portion of the silicon crystal cell 1 which is a top cell, there is provided a transparent electrode 3 so as to be held between a glass plate 4 and the silicon crystal cell 1. In the lower portion of the germanium-based crystal cell 2 which is a bottom cell, there is provided an electrode 5. Light entering from the transparent electrode 3 side is photoelectrically converted within the top cell and the bottom cell, and carriers thus generated are taken out through the electrodes (3, 5) as an electric current.

When forming the silicon crystal cell and the germanium-based crystal cell into a tandem structure, the photoelectric conversion element is constructed using the germanium-based crystal cell as a bottom cell. This is in order to allow relatively high-energy light ($hv_2$) to be photoelectrically converted in an efficient manner within the silicon crystal cell and to allow relatively low-energy light ($hv_1$), which is not photoelectrically converted by the silicon crystal cell, to be photoelectrically converted by the germanium-based crystal cell.

For this reason, a silicon layer is generally grown epitaxially on a single-crystal germanium-based substrate when fabricating a tandem-type photoelectric conversion element having such a structure as shown in FIG. 1.

However, a single-crystal germanium-based substrate has such problems that it is costly and scarce and that it is not available as a large-diameter substrate.

As means for solving these problems, it is possible to fabricate a tandem-type photoelectric conversion element having an Si/Ge-based structure using a substrate in which a germanium-based (Ge-based) crystal has been epitaxially grown on a silicon (Si) single-crystal substrate. In that case, there arise the following problems, however.

First, it is extremely difficult to further epitaxially grow Si on germanium (Ge) epitaxially grown on a silicon (Si) substrate. This is because the melting point of Ge (approximately 910° C.) is significantly lower than a temperature generally required for the epitaxial growth of Si.

Gases used for the epitaxial growth of Si include $SiH_4$, $SiH_2Cl_2$, $SiHCl_3$ and $SiCl_4$. The optimum decomposition temperatures of these gases are defined respectively as $SiH_4$: 950 to 1000° C., $SiH_2Cl_2$: 1050 to 1150° C., $SiHCl_3$: 1100 to 1200° C., and $SiCl_4$: 1150 to 1250° C. (according to M. L. Hammond, "Silicon epitaxy", Solid State Technol., Nov., pp. 68-75 (1978)). Accordingly, if Si is epitaxially grown at these temperatures, the underlying Ge epitaxial layer melts down. Consequently, it is unavoidable to perform the epitaxial growth of Si at a temperature lower than the optimum decomposition temperature and, therefore, it is difficult to obtain an Si layer of high crystal quality.

Alternatively, as shown in FIGS. 2(A) to 2(D), a silicon layer 1B whose conductivity type is opposite to that of the silicon single-crystal substrate 1A is previously formed thereon and layers of germanium-based crystal (2A, 2B) having mutually different conductivity types are laminated on this silicon layer (FIG. 2(A)). A supporting substrate 6 is bonded to a surface of the germanium-based crystal layer 2 (FIG. 2(B)) to make the crystal layer capable of being handled. The rear surface of the silicon single-crystal substrate 1A is polished (FIG. 2(C)) to a predetermined film thickness. Consequently, there is obtained a substrate for photoelectric elements suited for construction in which the silicon crystal cell serves as the top cell and the germanium-based crystal cell as the bottom cell (FIG. 2(D)). However, steps of polishing the rear surface of the silicon single-crystal substrate 1A and then cleaning the substrate after polishing are essential in such a process as described above. This essentiality not only makes a process for manufacturing a substrate for photoelectric conversion elements cumbersome and complicated but also raises the cost of manufacture. In particular, this essentiality makes it difficult to meet the needs for "cost reductions" required of a solar cell.

The present invention has been accomplished in view of the above-described problems. It is therefore an object of the present invention to provide a method for manufacturing a substrate whereby it is possible to provide a photoelectric conversion element having an Si/Ge-based structure at low costs.

DISCLOSURE OF THE INVENTION

In order to solve the above-described problems, a method for manufacturing a substrate for photoelectric conversion elements according to a first aspect of the present invention is characterized by including:

a first step of forming a silicon layer having a second conductivity type opposite to a first conductivity type on a surface layer of a silicon substrate having the first conductivity type;

a second step of forming a hydrogen ion-implanted layer by implanting ions into a silicon crystal region having the first conductivity type through the silicon layer having the second conductivity type;

a third step of vapor-phase growing a germanium-based crystal layer on the silicon layer having the second conductivity type by successively laminating germanium crystals or silicon-germanium mixed crystals having the first and second conductivity types;

a fourth step of applying a surface activation treatment to at least one of the surface of the supporting substrate and the surface of the germanium-based crystal layer;

a fifth step of bonding together the surface of the germanium-based crystal layer and the surface of the supporting substrate; and a sixth step of forming a laminated body composed of a germanium-based crystal and a silicon crystal on the supporting substrate by peeling off the surface layer of the silicon substrate along the hydrogen ion-implanted layer.

A method for manufacturing a substrate for photoelectric conversion elements according to a second aspect of the present invention is characterized by including:

a first step of forming a silicon layer having a second conductivity type opposite to a first conductivity type on a surface layer of a silicon substrate having the first conductivity type;

a second step of vapor-phase growing a germanium-based crystal layer on the silicon layer having the second conductivity type by successively laminating germanium crystals or silicon-germanium mixed crystals having the first and second conductivity types;

a third step of forming a hydrogen ion-implanted layer by implanting ions into a silicon crystal region having the first conductivity type through the germanium-based crystal layer;

a fourth step of applying a surface activation treatment to at least one of the surface of the supporting substrate and the surface of the germanium-based crystal layer;

a fifth step of bonding together the surface of the germanium-based crystal layer and the surface of the supporting substrate; and a sixth step of forming a laminated body composed of a germanium-based crystal and a silicon crystal on the supporting substrate by peeling off the surface layer of the silicon substrate along the hydrogen ion-implanted layer.

In these manufacturing methods, the fourth step of surface activation treatment is preferably carried out by means of at least one of plasma treatment and ozone treatment.

In addition, the fifth step may include a sub-step of heat-treating the germanium-based crystal layer and the supporting substrate after the bonding together, with the germanium-based crystal layer and the supporting substrate bonded together.

In the present invention, the sub-step of heat treatment is preferably carried out at a temperature of 100° C. or higher but not higher than 300° C.

In addition, the manufacturing method may include a seventh step of successively vapor-phase growing III-V group-based compound semiconductor crystals having the second and first conductivity types on the silicon crystal of the laminated body.

Furthermore, the manufacturing method can include a step of forming a silicon layer having an intrinsic conductivity type between the surface layer of the silicon substrate having the first conductivity type and the silicon layer having the second conductivity type. Alternatively, the manufacturing method can include a step of forming a germanium-based crystal layer having an intrinsic conductivity type between the germanium-based crystal having the first conductivity type and a germanium-based crystal having the second conductivity type. Still alternatively, the manufacturing method can include a step of forming a III-V group-based compound semiconductor crystal layer having an intrinsic conductivity type between the III-V group-based compound semiconductor crystal having the first conductivity type and a III-V group-based compound semiconductor crystal having the second conductivity type.

In the present invention, it is possible to provide a substrate for the manufacture of a tandem-type photoelectric conversion element having an Si/Ge-based structure, without using a costly germanium substrate, thereby contributing to reducing the cost of manufacturing the tandem-type photoelectric conversion element having an Si/Ge-based structure.

Further, in the present invention, since there is no need for high-temperature treatment (for example, 1000° C. or higher), no problems are caused for the manufacture of a substrate having an Si/Ge-based structure for which a substrate of low-melting point germanium-based crystal or the growth of the crystal is essential.

Still further, the ability of performing bonding and separation using low-temperature processes alone also has the advantage of not exerting any significant effects on an impurity (dopant) profile within crystals.

BRIEF DESCRIPTION OF THE DRAWINGS

FIGS. 7(A) to 7(C) are conceptual schematic views used to exemplify various techniques for silicon thin film separation, wherein FIG. 7(A) is an example of performing separation by thermal shock, FIG. 7(B) is an example of performing separation by mechanical shock, and FIG. 7(C) is an example of performing separation by vibratory shock.

BEST MODE FOR CARRYING OUT THE INVENTION

Hereinafter, the best mode for carrying out the present invention will be described with reference to the accompanying drawings.

Figure 1:
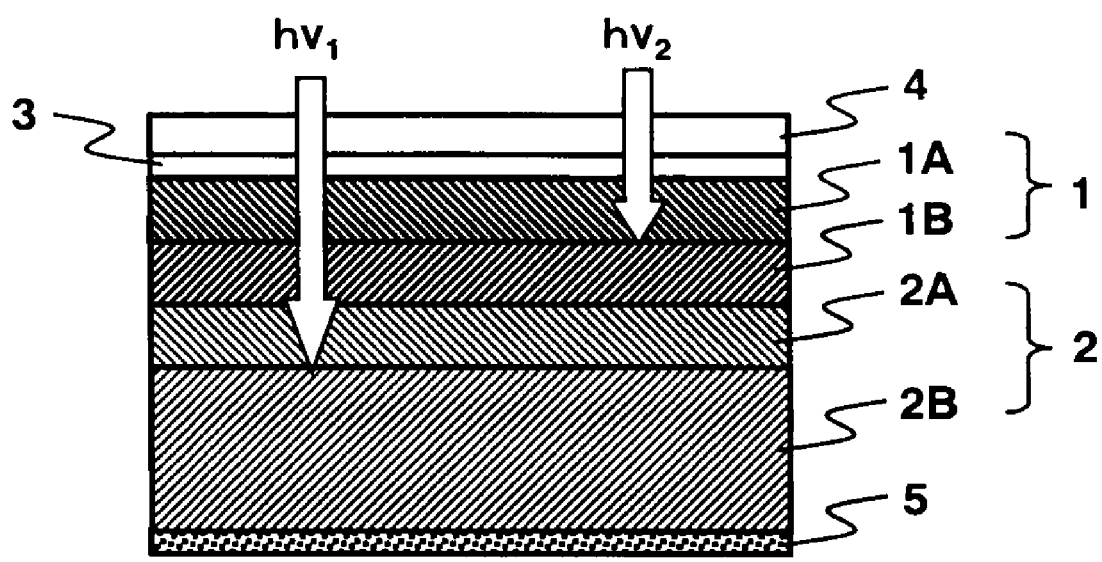
FIG. 1 is a cross-sectional schematic view used to explain the structure of a conventional tandem-structured photoelectric conversion element laminated with a silicon crystal cell and a germanium-based crystal cell.
Figure 2A:
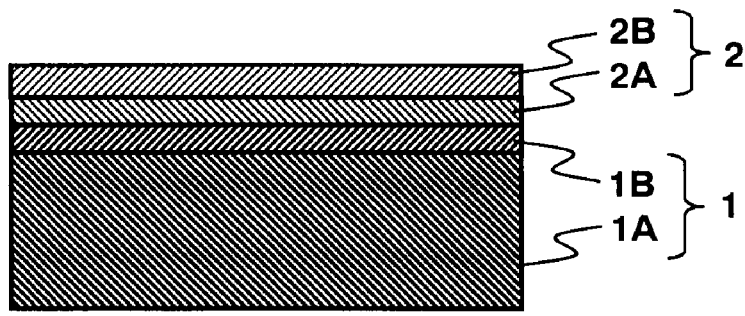
FIGS. 2(A) to 2(D) are schematic views used to explain a process example of obtaining a substrate for tandem-type photoelectric conversion elements having an Si/Ge-based structure using a substrate in which a Ge-based crystal has been epitaxially grown on an Si substrate.
Figure 2B:
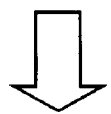
Figure 2B:
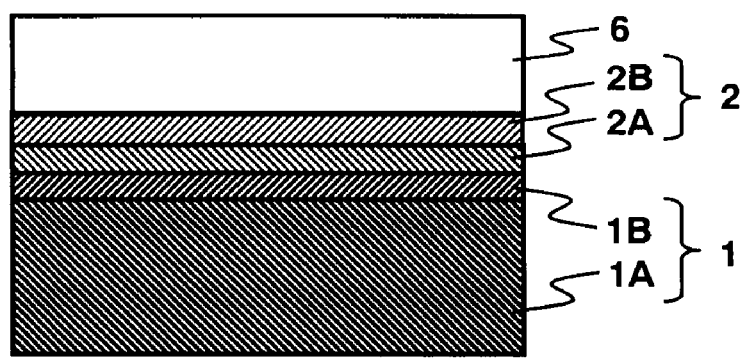
Figure 2C:
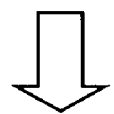
Figure 2C:
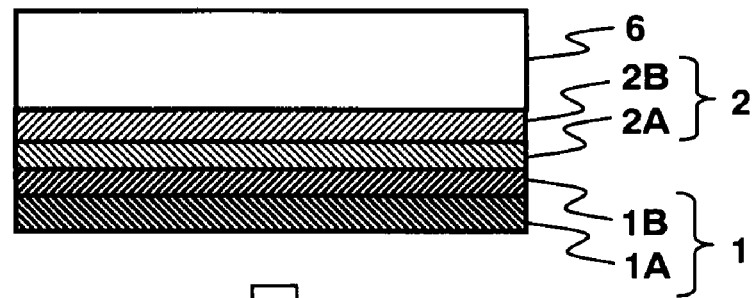
Figure 2D:
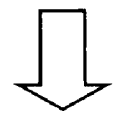
Figure 2D:
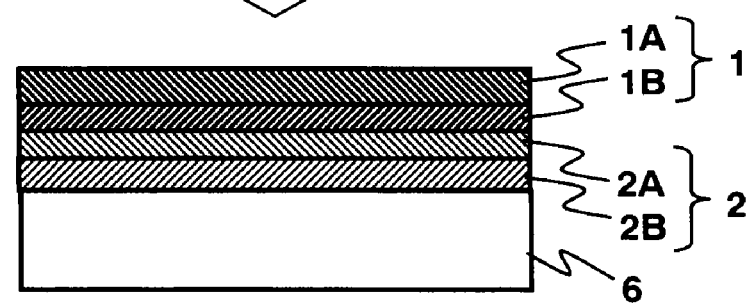
Figure 3A:
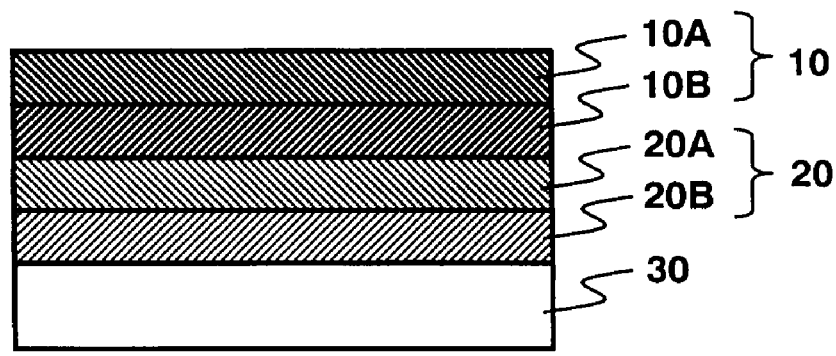
FIGS. 3(A) to 3(C) are schematic views shown by way of example to conceptually explain a cross-section of a substrate for photoelectric conversion elements obtainable by a method of the present invention.
Figure 3B:
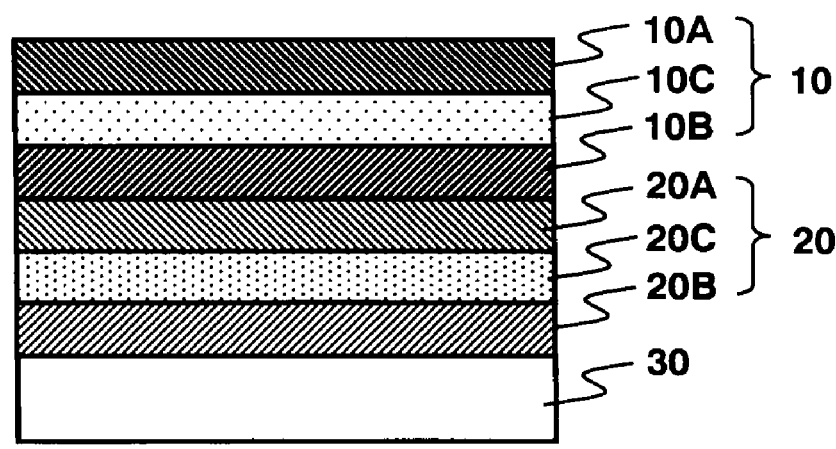
Figure 3C:
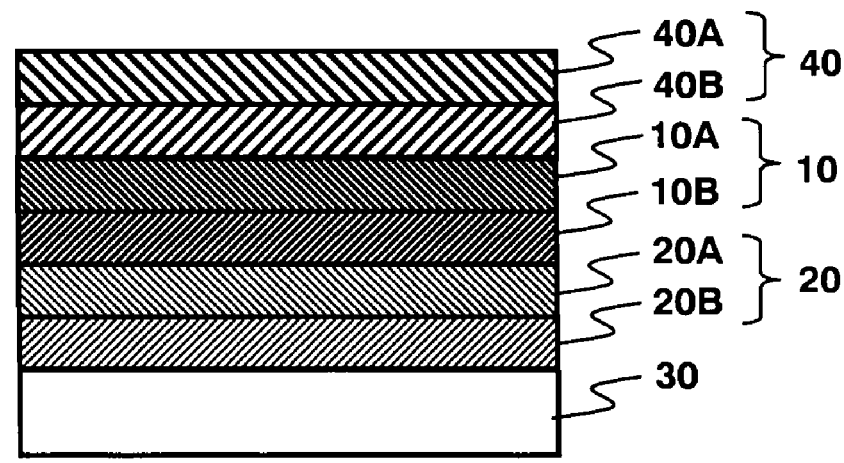

[Basic structure of substrate for photoelectric conversion elements]: FIGS. 3(A) to 3(C) are schematic views shown by way of example to conceptually explain a cross-section of a substrate for photoelectric conversion elements obtainable by a method of the present invention.

In the example shown in FIG. 3(A), a laminated body composed of a germanium-based crystal 20 and a silicon crystal 10 formed using a later-described separation method is provided on a supporting substrate 30. Of these crystals, the silicon crystal 10 is obtained by peeling off a region having a predetermined thickness on the mirror-polished surface side of a single-crystal Si substrate using a later-described procedure, whereas the single-crystal Si substrate is a commercially-available Si substrate grown by the CZ method (Czochralski method). The electrical property values, such as the conductivity type and specific resistivity, the crystal orientation and the crystal diameter of the single-crystal Si substrate are selected as appropriate depending on a photoelectric conversion element to which the substrate manufactured using the method of the present invention is devoted.

In addition, the germanium-based crystal 20 is obtained by previously growing the crystal on the silicon crystal 10 using a gas-phase method such as UHVCVD, LPCVD or MOVPE. The germanium-based crystal 20 is bonded onto the supporting substrate 30 while being laminated on this silicon crystal 10 as the result of the silicon crystal being peeled off.

Both of the silicon crystal 10 and the germanium-based crystal 20 are composed of layers having mutually different conductivity types (10A and 10B, and 20A and 20B). Of these layers, the silicon crystal layer 10B is provided on a silicon substrate prior to the vapor-phase growth of the germanium-based crystal 20 to form a pn junction at a boundary face between the silicon crystal layer 10B and the silicon crystal layer 10A. A pn junction is also formed at a boundary face between the silicon crystal 10 and the germanium-based crystal 20 (i.e., a boundary face between the layers 10B and 20A).

The example shown in FIG. 3(B) is such that in the construction shown in FIG. 3(A), layers of intrinsic conductivity types (i layers) intended to increase photoelectric conversion efficiency in a case where cells are respectively formed in the silicon crystal 10 and the germanium-based crystal 20 are provided by vapor-phase growth between the "p" and "n" layers of the silicon crystal 10 and between the "p" and "n" layers of the germanium-based crystal 20 (i.e., between the layers 10A and 10B, and between the layers 20A and 20B) (10C, 20C).

The example shown in FIG. 3(C) is such that in the construction shown in FIG. 3(A), a III-V group-based compound semiconductor crystal 40 is additionally formed by vapor-phase growth on the silicon crystal 10. This III-V group-based compound semiconductor crystal 40 is also composed of layers having mutually different conductivity types (40A and 40B), and a pn junction is formed at a boundary face between the layers. A pn junction is also formed at a boundary face between the III-V group-based compound semiconductor crystal 40 and the silicon crystal 10 (i.e., a boundary face between the layers 10A and 40B). Note that the III-V group-based compound semiconductor crystal 40 shown in this figure may be provided on the silicon crystal 10A of the structure illustrated in FIG. 3(B).

The germanium-based crystal 20 can also be a germanium-silicon mixed crystal ($Si_xGe_{1-x}$), not to mention an elementary substance of germanium crystal. In this case, the mixed crystal ratio of germanium and silicon may be varied within a germanium-based crystal layer or layers (20A and/or 20B), so that the germanium-based crystal 20 functions as a buffer layer for alleviating lattice mismatch with the silicon crystal layer 10B. Alternatively, the band gaps of crystal layers may be designed to predetermined values.

No particular restrictions are imposed on the supporting substrate 30 as long as the substrate can be bonded to the germanium-based crystal 20 using a later-described technique. The supporting substrate 30 can therefore be a silicon substrate, a glass substrate, a quartz substrate, a sapphire (alumina) substrate, a ceramic substrate, or the like.

Figure 4A:
FIGS. 4(A) to 4(E) are process drawings used to explain a first example of a method for manufacturing a substrate for photoelectric conversion elements of the present invention.

[Example 1 of method for manufacturing substrate for photoelectric conversion elements]: FIGS. 4(A) to 4(E) are process drawings used to explain a first example of a method for manufacturing a substrate for photoelectric conversion elements of the present invention. In FIG. 4(A), reference numeral 100 denotes a single-crystal silicon substrate on a surface of which a silicon layer 10B having a conductivity type opposite to that of a bulk is provided. This silicon layer 10B is vapor-phase grown using an MOVPE method or the like. In the present method example, the conductivity type of the silicon substrate 100 is "n" as the substrate is doped with phosphorous (P). The silicon layer 10B formed on this substrate by epitaxial growth using a vapor-phase method is doped with boron (B), so as to have a conductivity type of "p".

Figure 4B:
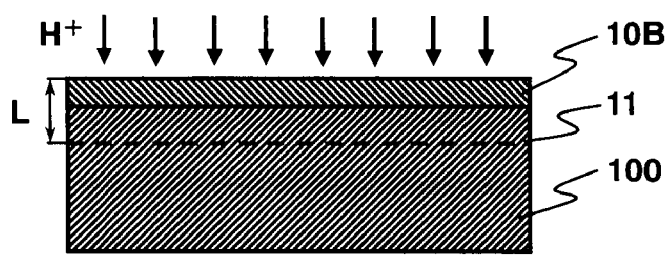

A hydrogen ion-implanted layer 11 is formed by implanting hydrogen ions to a predetermined depth (L) into the surface region of the silicon substrate 100 through the silicon layer 10B (FIG. 4(B)). The dose amount at the time of hydrogen ion implantation is specified as approximately $10^{16}$ to $10^{17}$ atoms/cm$^2$ and the average ion implantation depth L (depth from the surface of the silicon layer 10B) is set to a value almost the same as the thickness of a silicon layer (10A) to be subsequently obtained by means of separation.

Figure 4C:
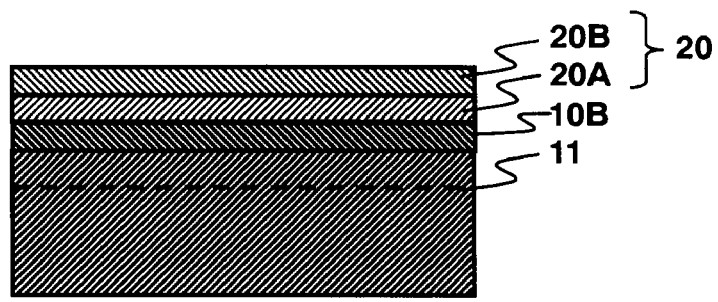

Then, a germanium-based crystal 20 is provided by successively vapor-phase growing a germanium-based crystal layer 20A having an "n" conductivity type opposite to that of the silicon layer 10B and a germanium-based crystal layer 20B having a "p" conductivity type opposite to that of the germanium-based crystal layer 20A (FIG. 4(C)).

Figure 4D:
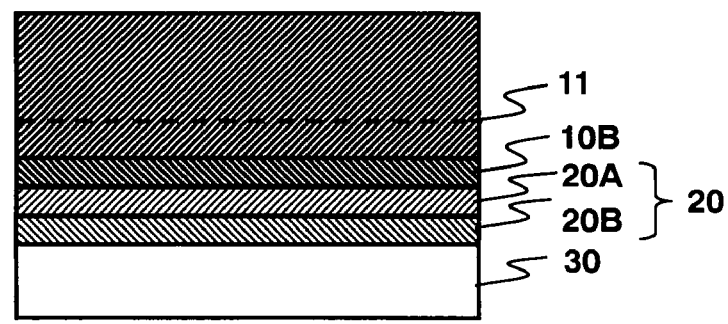
Figure 4E:
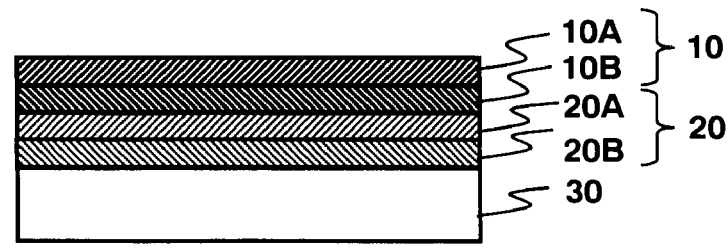

The surface of the germanium-based crystal 20 (i.e., the surface of the germanium-based crystal layer 20B) thus obtained and the surface of a supporting substrate 30 separately prepared are bonded together (FIG. 4(D)). In this state, impact is applied externally to separate the silicon crystal 10 from the silicon substrate 100 along the hydrogen ion-implanted layer 11, thereby transferring (peeling off) a laminated structure composed of the germanium-based crystal 20 and the silicon crystal 10 onto the supporting substrate 30 (FIG. 4(E)) and obtaining a substrate having the structure illustrated in FIG. 3(A).

[Example 2 of method for manufacturing substrate for photoelectric conversion elements]: FIGS. 5(A) to 5(E) are process drawings used to explain a second example of a method for manufacturing a substrate for photoelectric conversion elements of the present invention. Example 2 differs from example 1 explained in FIG. 4 in that hydrogen ion implantation is performed after the growth of the germanium-based crystal 20.

Figure 5A:
FIGS. 5(A) to 5(E) are process drawings used to explain a second example of a method for manufacturing a substrate for photoelectric conversion elements of the present invention.

FIG. 5(A) shows a single-crystal silicon substrate 100 on the surface of which the silicon layer 10B having a conductivity type opposite to that of a bulk is provided. Also in the present method example, the conductivity type of the silicon substrate 100 is "n" as the substrate is doped with phosphorous (P). The silicon layer 10B formed on this substrate by epitaxial growth using a vapor-phase method is doped with boron (B), so as to have a conductivity type of "p".

Figure 5B:
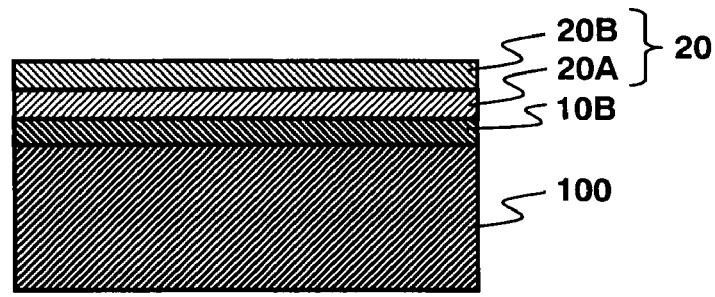
Figure 5C:
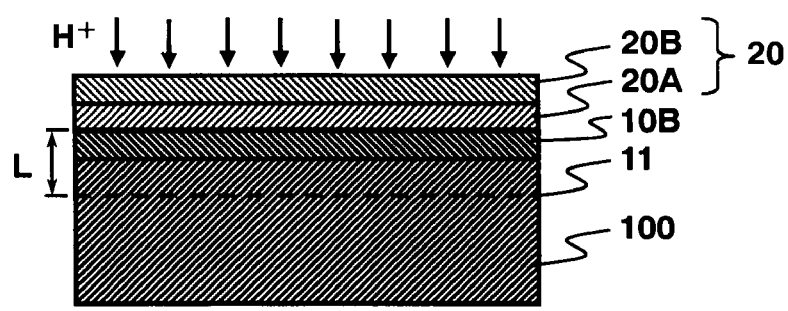

On this silicon layer 10B, there is provided a germanium-based crystal 20 by successively vapor-phase growing a germanium-based crystal layer 20A having an "n" conductivity type opposite to that of the silicon layer 10B and a germanium-based crystal layer 20B having a "p" conductivity type opposite to that of the germanium-based crystal layer 20A (FIG. 5(B)). Hydrogen ions are implanted through this germanium-based crystal 20 to form a hydrogen ion-implanted layer 11 at a predetermined depth (L) in the surface region of the silicon substrate 100 (FIG. 5(C)). Also in this case, the dose amount at the time of hydrogen ion implantation is specified as approximately $10^{16}$ to $10^{17}$ atoms/cm$^2$ and the average ion implantation depth L (depth from the surface of the silicon layer 10B) is set to a value almost the same as the thickness of a silicon layer (10A) to be subsequently obtained by means of separation.

Figure 5D:
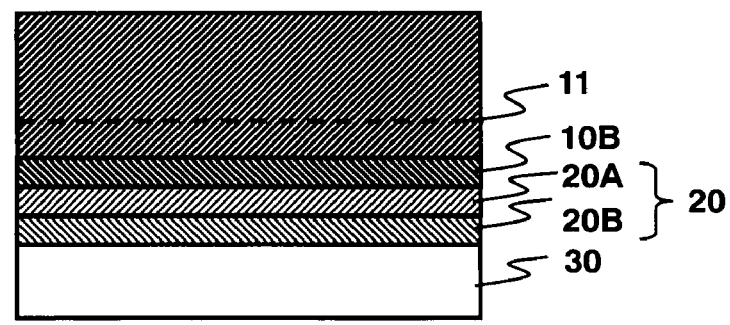
Figure 5E:
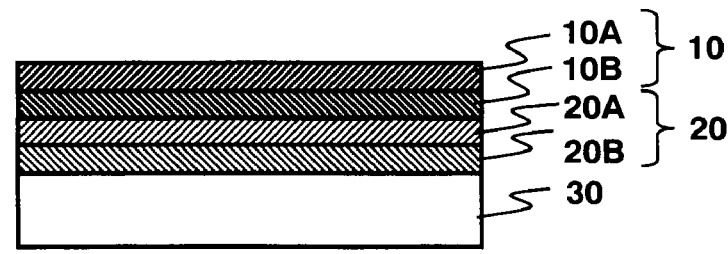

Then, the surface of the germanium-based crystal 20 (i.e., the surface of the germanium-based crystal layer 20B) and the surface of a supporting substrate 30 are bonded together (FIG. 5(D)) and impact is applied externally to separate the silicon crystal 10 from the silicon substrate 100 along the hydrogen ion-implanted layer 11, thereby transferring (peeling off) a laminated structure composed of the germanium-based crystal 20 and the silicon crystal 10 onto the supporting substrate 30 (FIG. 5(E)) and obtaining a substrate having the structure illustrated in FIG. 3(A).

Hereinafter, a method for manufacturing a substrate for photoelectric conversion elements of the present invention will be described with reference to embodiments thereof.

EMBODIMENTS

Figure 6A:
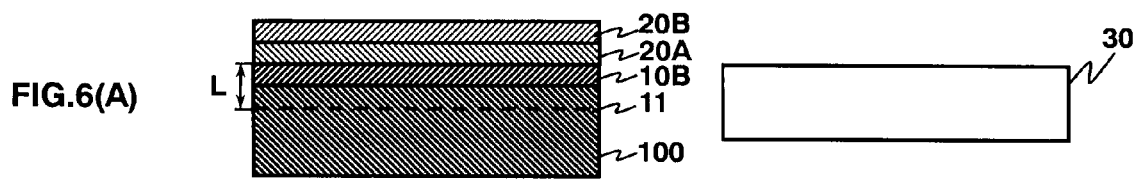
FIGS. 6(A) to 6(E) are schematic views used to explain a process in an embodiment of a method for manufacturing a substrate for photoelectric conversion elements of the present invention.

FIGS. 6(A) to 6(E) are schematic views used to explain a process in the present embodiment. As illustrated in FIG. 6(A), a p-type silicon layer 10B is provided on one surface of a silicon substrate 100 having an "n" conductivity type using a vapor-phase growth method. In addition, there is formed a hydrogen ion-implanted layer 11 having an average ion implantation depth of 2 μm by hydrogen ion implantation at a dose amount of 1×10$^{17}$ atoms/cm$^2$. On the silicon layer 10B, there is formed a germanium crystal 20 by means of vapor-phase growth in which germanium-based crystal layers 20A and 20B are successively laminated.

In the present embodiment, the germanium-based crystal 20 is defined as a mixed crystal of germanium and silicon ($Si_xGe_{1-x}$), and the mixed crystal ratio of germanium and silicon is varied within a germanium-based crystal layer or layers (20A and/or 20B), so that the germanium-based crystal 20 functions as a buffer layer for alleviating lattice mismatch with the silicon crystal layer 10B. In addition, there is prepared a supporting substrate 30 to be used in later bonding. In the present embodiment, the supporting substrate 30 is defined as a silicon substrate.

Figure 6B:
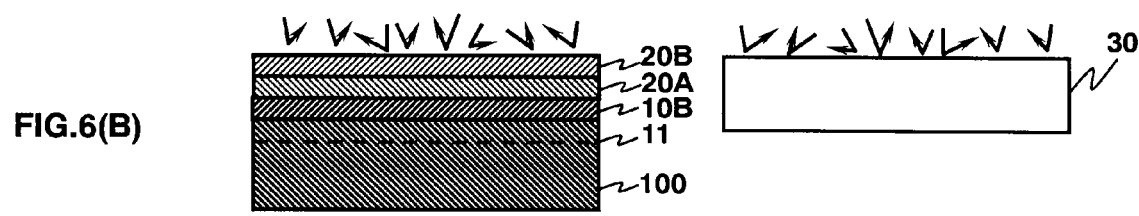

Next, a plasma treatment or an ozone treatment for the purpose of surface cleaning, surface activation and the like is applied to the surface (bonding surface) of the germanium-based crystal layer 20B and the bonding surface of the supporting substrate 30 (FIG. 6(B)). Note that such a surface treatment as described above is performed for the purpose of removing organic matter from a surface serving as a bonding surface or achieving surface activation by increasing surface OH groups. However, the surface treatment need not necessarily be applied to both of the surfaces of the germanium-based crystal layer 20B and the supporting substrate 30. Rather, the surface treatment may be applied to either one of the two bonding surfaces.

When carrying out this surface treatment by means of plasma treatment, a surface-cleaned substrate to which RCA cleaning or the like has been applied previously is mounted on a sample stage within a vacuum chamber, and a gas for plasma is introduced into the vacuum chamber so that a predetermined degree of vacuum is reached. Note that examples of gas species for plasma used here include an oxygen gas, a hydrogen gas, an argon gas, a mixed gas thereof, or a mixed gas of hydrogen and helium. The gas for plasma can be changed as appropriate according to the surface condition of the substrate or the purpose of use thereof. High-frequency plasma having an electrical power of approximately 100 W is generated after the introduction of the gas for plasma, thereby applying the surface treatment for approximately 5 to 10 seconds to a surface of the substrate to be plasma-treated, and then finishing the surface treatment.

When the surface treatment is carried out by means of ozone treatment, a surface-cleaned substrate to which RCA cleaning or the like has been applied previously is mounted on a sample stage within a chamber placed in an oxygen-containing atmosphere. Then, after introducing a gas for plasma, such as a nitrogen gas or an argon gas, into the chamber, high-frequency plasma having a predetermined electrical power is generated to convert oxygen in the atmosphere into ozone by the plasma. Thus, a surface treatment is applied for a predetermined length of time to a surface of the substrate to be treated.

Figure 6C:
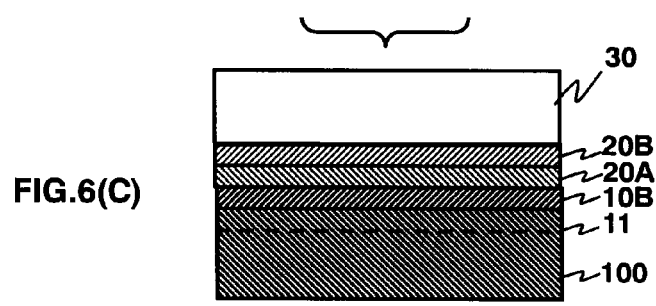

After such a surface treatment as described above, the surface of the germanium-based crystal layer 20B and the surface of the supporting substrate 30 are bonded together with the surfaces thereof closely adhered to each other (FIG. 6(C)). As described above, the surface of at least one of the germanium-based crystal layer 20B and the supporting substrate 30 has been subjected to a treatment, such as a plasma treatment, an ozone treatment or the like, and is therefore in an activated state. Thus, it is possible to obtain a level of bonding strength fully resistant to mechanical separation or mechanical polishing in a post-process even if the surfaces are closely adhered to each other (bonded together) at room temperature. If the surfaces need to have an even higher level of bonding strength, there may be applied a heating treatment (bonding process) at a relatively low temperature.

The bonding process temperature at this time is selected as appropriate according to the type of a substrate to be used for bonding. If the thermal expansion coefficients of the two substrates significantly differ from each other, the temperature is set to 450° C. or lower, for example, within a range from 200 to 450° C.

Figure 6D:
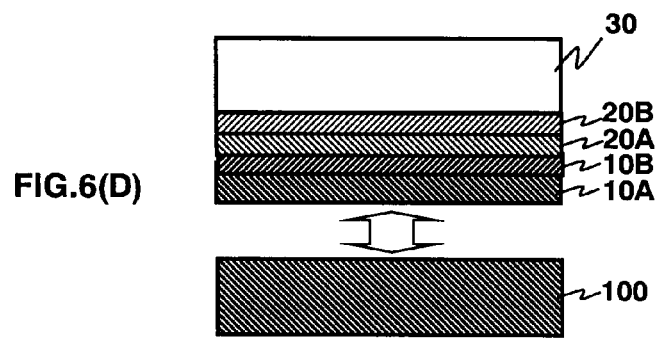
Figure 6E:
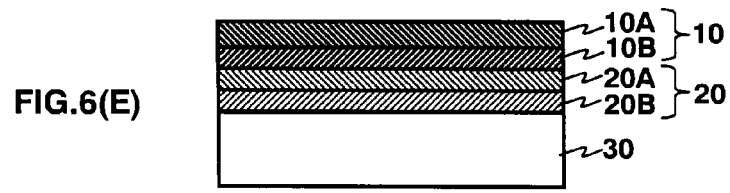

In succession to such a treatment as described above, a silicon thin film (silicon layer 10A) is peeled off along the hydrogen ion-implanted layer 11 by applying external impact to the bonded substrate using a certain technique (FIG. 6(D)), thereby obtaining a laminated structure composed of the germanium-based crystal 20 and the silicon crystal 10 on the supporting substrate 30 (FIG. 6(E)).

Figure 7A:
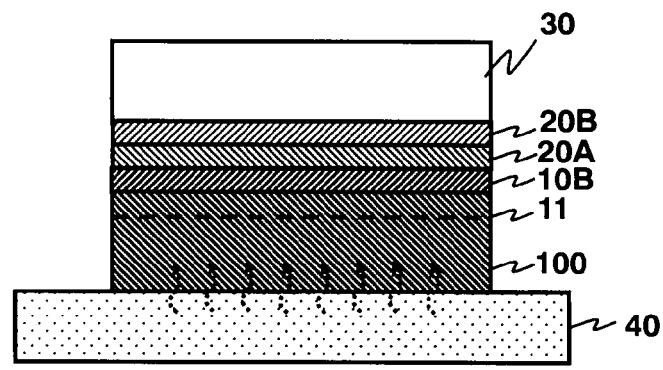
Figure 7B:
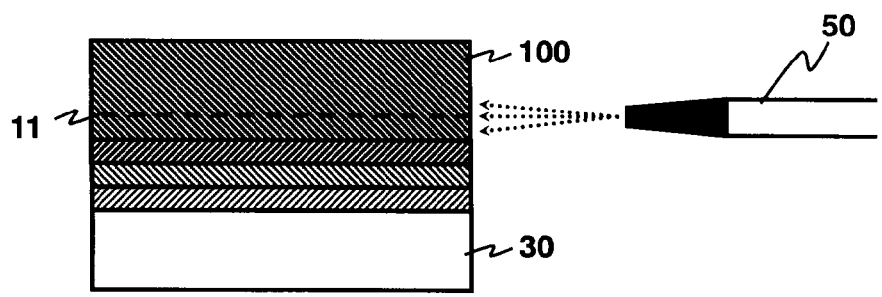
Figure 7C:
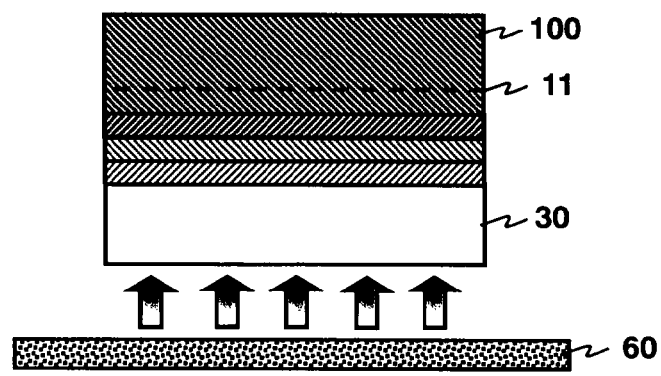

Note here that there can be various ways of externally applying impact in order to peel off the silicon thin film (silicon layer 10A). FIGS. 7(A) to 7(C) are conceptual schematic views used to exemplify various techniques for silicon thin film separation, wherein FIG. 7(A) is an example of performing separation by thermal shock, FIG. 7(B) is an example of performing separation by mechanical shock, and FIG. 7(C) is an example of performing separation by vibratory shock.

In FIG. 7(A), reference numeral 40 denotes a heating section, such as a hot plate, having a smooth surface, and the bonded substrate is mounted on the smooth surface of the heating section 40 kept at, for example, approximately 300° C. In FIG. 7(A), a glass substrate is used as the supporting substrate 30, and the silicon substrate 100 is mounted so as to closely adhere to the heating section 40. The silicon substrate 100 is heated by thermal conduction and a stress is generated between the silicon substrate 100 and the supporting substrate 30 by a temperature difference produced between the two substrates. The separation of a silicon thin film along the hydrogen ion-implanted layer 11 is caused by this stress.

The example illustrated in FIG. 7(B) utilizes a jet of a fluid to apply mechanical shock. That is, a fluid, such as a gas or a liquid, is sprayed in a jet-like manner from the leading end of a nozzle 50 at a side surface of the silicon substrate 100 (near the hydrogen ion-implanted layer 11), thereby applying impact. An alternative technique, for example, is to apply impact by pressing the leading end of a blade against a region near the hydrogen ion-implanted layer 11.

Yet alternatively, as illustrated in FIG. 7(C), the separation of the silicon thin film may be caused by applying vibratory shock using ultrasonic waves emitted from the vibrating plate 60 of an ultrasonic oscillator.

Note that whereas a conventional "bonding method" requires high-temperature heat treatments for the purpose of obtaining sufficient bonding strength or breaking silicon atomic bonds (see, for example, Japanese Patent No. 3048201 and Japanese Patent Laid-Open No. 11-145438), the present invention does not require such high-temperature heat treatments (for example, 1000° C. or higher). Accordingly, no problems are caused for the manufacture of a substrate having an Si/Ge-based structure for which a substrate of low-melting point germanium-based crystal is essential. In addition, the ability of performing bonding and separation using low-temperature processes alone also has the advantage of not exerting any significant effects on an impurity (dopant) profile within crystals.

As described above, in the present invention, it is possible to provide a substrate for the manufacture of a tandem-type photoelectric conversion element having an Si/Ge-based structure, without using a costly germanium substrate, thereby reducing the cost of manufacturing the tandem-type photoelectric conversion element having an Si/Ge-based structure.

While aspects of the present invention have been described with reference to the embodiments thereof, it should be noted that the above-described embodiments are merely examples for carrying out the present invention and the present invention is not limited to these embodiments. Modifying these embodiments variously is within the scope of the present invention and it is obvious, from the foregoing description, that other various embodiments are possible within the scope of the present invention.

INDUSTRIAL APPLICABILITY

The present invention provides a substrate for realizing cost reductions in the manufacture of a tandem-type photoelectric conversion element having an Si/Ge-based structure.

The invention claimed is:

1. A method for manufacturing a substrate for photoelectric conversion elements, the method comprising:
    first, forming a silicon layer having a second conductivity type opposite to a first conductivity type on a surface layer of a silicon substrate having said first conductivity type;
    second, forming a hydrogen ion-implanted layer by implanting ions into a silicon crystal region having said first conductivity type through said silicon layer having said second conductivity type;
    third, vapor-phase growing a germanium-based crystal layer on said silicon layer having said second conductivity type by successively laminating germanium crystals or silicon-germanium mixed crystals having said first and second conductivity types;
    fourth, applying a surface activation treatment to at least one surface selected from the group consisting of a surface of a supporting substrate and a surface of said germanium-based crystal layer;
    fifth, bonding together the surface of said germanium-based crystal layer and the surface of said supporting substrate; and
    sixth, forming a laminated body composed of a germanium-based crystal and a silicon crystal on said supporting substrate by peeling off the surface layer of said silicon substrate along said hydrogen ion-implanted layer.

2. The method for manufacturing a substrate for photoelectric conversion elements according to claim 1, characterized in that said fourth applying of surface activation treatment is carried out with at least one of plasma treatment and ozone treatment.

3. The method for manufacturing a substrate for photoelectric conversion elements according to claim 1, characterized in that said fifth bonding together further comprises a heat-treating said germanium-based crystal layer and said supporting substrate after said bonding together, with said germanium-based crystal layer and said supporting substrate bonded together.

4. The method for manufacturing a substrate for photoelectric conversion elements according to claim 1, further comprising:
    seventh successively vapor-phase growing III-V group-based compound semiconductor crystals having said second and first conductivity types on said silicon crystal of said laminated body.

5. The method for manufacturing a substrate for photoelectric conversion elements according to claim 1, characterized by further comprising forming a silicon layer having an intrinsic conductivity type between the surface layer of said silicon substrate having said first conductivity type and said silicon layer having said second conductivity type.

6. The method for manufacturing a substrate for photoelectric conversion elements according to claim 1, further comprising forming a germanium-based crystal layer having an intrinsic conductivity type between said germanium-based crystal having said first conductivity type and a germanium-based crystal having said second conductivity type.

7. The method for manufacturing a substrate for photoelectric conversion elements according to claim 3, characterized in that said heat treating is carried out at a temperature of 100° C. or higher but not higher than 300° C.

8. The method for manufacturing a substrate for photoelectric conversion elements according to claim 4, further comprising forming a III-V group-based compound semiconductor crystal layer having an intrinsic conductivity type between said III-V group-based compound semiconductor crystal having said first conductivity type and a III-V group-based compound semiconductor crystal having said second conductivity type.

9. A method for manufacturing a substrate for photoelectric conversion elements, the method comprising:
    first, forming a silicon layer having a second conductivity type opposite to a first conductivity type on a surface layer of a silicon substrate having said first conductivity type;
    second, vapor-phase growing a germanium-based crystal layer on said silicon layer having said second conductivity type by successively laminating germanium crystals or silicon-germanium mixed crystals having said first and second conductivity types;

third, forming a hydrogen ion-implanted layer by implanting ions into a silicon crystal region having said first conductivity type through said germanium-based crystal layer;

fourth, applying a surface activation treatment to at least surface selected from the group consisting of a surface of a supporting substrate and a surface of said germanium-based crystal layer;

fifth, bonding together the surface of said germanium-based crystal layer and the surface of said supporting substrate; and sixth, forming a laminated body composed of a germanium-based crystal and a silicon crystal on said supporting substrate by peeling off the surface layer of said silicon substrate along said hydrogen ion-implanted layer.

10. The method for manufacturing a substrate for photoelectric conversion elements according to claim 9, characterized in that said fourth applying a surface activation treatment is carried out with at least one of plasma treatment and ozone treatment.

11. The method for manufacturing a substrate for photoelectric conversion elements according to claim 9, characterized in that said fifth bonding together further comprises heat-treating said germanium-based crystal layer and said supporting substrate after said bonding together, with said germanium-based crystal layer and said supporting substrate bonded together.

12. The method for manufacturing a substrate for photoelectric conversion elements according to claim 11, characterized in that said heat treating is carried out at a temperature of 100° C. or higher but not higher than 300° C.

13. The method for manufacturing a substrate for photoelectric conversion elements according to claim 9, further comprising:

seventh, successively vapor-phase growing III-V group-based compound semiconductor crystals having said second and first conductivity types on said silicon crystal of said laminated body.

14. The method for manufacturing a substrate for photoelectric conversion elements according to claim 9, further comprising forming a silicon layer having an intrinsic conductivity type between the surface layer of said silicon substrate having said first conductivity type and said silicon layer having said second conductivity type.

15. The method for manufacturing a substrate for photoelectric conversion elements according to claim 9, further comprising forming a germanium-based crystal layer having an intrinsic conductivity type between said germanium-based crystal having said first conductivity type and a germanium-based crystal having said second conductivity type.

16. The method for manufacturing a substrate for photoelectric conversion elements according to claim 13, further comprising forming a III-V group-based compound semiconductor crystal layer having an intrinsic conductivity type between said III-V group-based compound semiconductor crystal having said first conductivity type and a III-V group-based compound semiconductor crystal having said second conductivity type.

* * * * *